United States Patent [19]

Podvin

[11] Patent Number: 5,142,697
[45] Date of Patent: Aug. 25, 1992

[54] BALANCED HIGH-FREQUENCY MIXER HAVING A BALUN CIRCUIT

[75] Inventor: Dominique Podvin, Bures Sur Yvette, France

[73] Assignee: U.S. Philips Corporation, New York, N.Y.

[21] Appl. No.: 576,323

[22] Filed: Aug. 29, 1990

[30] Foreign Application Priority Data

Sep. 26, 1989 [FR] France ............... 89 12585

[51] Int. Cl.⁵ .................................... H04B 1/26
[52] U.S. Cl. ............................ 455/326; 455/330
[58] Field of Search ........... 455/323, 325, 326, 330, 455/327; 333/26, 156, 204, 208

[56] References Cited

U.S. PATENT DOCUMENTS 4,651,344 3/1987 Hasegawa et al. ............... 455/330
4,864,644 9/1989 Takahashi et al. ............... 455/326

FOREIGN PATENT DOCUMENTS 0213864 3/1987 European Pat. Off.

*Primary Examiner*—Curtis Kuntz
*Attorney, Agent, or Firm*—Edward W. Goodman

[57] ABSTRACT

This balanced high-frequency mixer is formed around a circuit of the "Balun" type. Though realized for operation in a frequency range from about 1 GHz to 10 GHz, the dielectric substrate SUB used is chosen from the high-loss dielectric materials such as epoxy glass thus permitting to distinctly reduce its cost price. Printed on the substrate is an adapting circuit by partly covered microstrip lines $L_1$, $L_2$, $L_1$ by a semi-rigid coaxial cable section CC, $L_2$ by a conductor line section CA having the same diameter and the same length as the coaxial cable. The performance of a mixer of this type is comparable to that of a 6 $\lambda/4$ mixer with clearly less cumbersomeness, of the order of that of a de Lange coupler.

3 Claims, 2 Drawing Sheets

BALANCED HIGH-FREQUENCY MIXER HAVING A BALUN CIRCUIT

BACKGROUND OF THE INVENTION

1. Field of the Invention

The present invention relates to a balanced high-frequency mixer formed around a circuit of the "Balun" type mainly constituted by a dielectric substrate supporting configurations of conductor material such as lines and ground plane situated in parallel or coinciding planes.

2. Description of the Related Art

Generally, the balanced high-frequency mixers using circuits of the microstrip type are constituted by a coupler having a strong coupling (3 dB) associated to diodes combining the non-linear element of the mixer. Such a coupler is presented in European Patent Application No. 0 213 864 describing a circuit of the "Balun" type, that is to say, a circuit allowing to couple a balanced line with a non-balanced line. In said Patent Application the "Balun" circuit is thus mainly constituted by a dielectric substrate on whose surface lines of conductor material are deposited. It is a well known fact that when the substrate presents a considerable dielectric loss, the operation of the mixer will be degraded. Thus, the conventional solution consists of producing a mixer manufactured on a low-loss substrate also called noble substrate, such as teflon glass, duroid or as it is proposed in above Patent Application, a ceramic or a semiconductor material. The main disadvantage of the choice of this type of substrate relates to the manufacturing cost of the mixer.

SUMMARY OF THE INVENTION

It is an object of the present invention to remedy this disadvantage and propose a mixer of which the manufacturing cost and thus the cost price is reduced considerably whereas it presents good performance.

For this purpose, the high-frequency mixer mentioned in the opening paragraph is characterised in that the substrate is chosen, on the one hand, from high-loss dielectric materials and, on the other hand, a section of semi-rigid low-loss coaxial cable is associated to a line of conductor material while a conductor wire section of the same length and the same diameter as the cable, connected to the cable, is associated to a second line of conductor material while said coaxial cable and wire sections at least partly cover said lines of conductor material.

Thus the inventive concept consists of utilized, contrary to all expectations in the high-frequency domain, a high-loss substrate (not specifically used at high frequencies) as well as sections of coaxial cable and conductor wire soldered onto balancing lines for applications of which the operating frequency may be of the order of 10 GHz. At such high frequencies those skilled in the art will certainly condemn the choice of such a substrate or the use of a coaxial cable. But experience has taught that the mixer according to the invention operates and shows a performance at all points equivalent to that of a mixer of the 6 $\lambda/4$ type, whereas a cumbersomeness is presented of the order of that of the de Lange coupler at distinctly reduced cost. In effect, the "Balun" circuit constituted, for example, by a semi-rigid low-loss cable is soldered by its sleeve onto a balancing line; the elements of the mixer that present losses are thus minimized: soldering studs of the diodes and balancing lines.

According to a preferred embodiment a two-sided epoxy glass printed circuit is used, the high-loss dielectric substrate being constituted by the epoxy glass, the conductor lines and ground plane being obtained by engraving the printed circuit, while the semi-rigid coaxial cable sections and conductor wire sections are soldered onto the conductor lines. In effect, epoxy glass is an inexpensive and robust material, whose robustness permits to reduce the volume of the structure of the mixer, because the surrounding structure is no longer necessary.

Finally, according to an embodiment, a multilayer epoxy glass printed circuit can be advantageously used, because such a configuration allows to perform a plurality of functions.

BRIEF DESCRIPTION OF THE DRAWINGS

The following description with reference to the annexed drawings, given by way of non-limiting example, will make it better understood how the invention can be implemented, in which.

DESCRIPTION OF THE PREFERRED EMBODIMENTS

Figure 1:
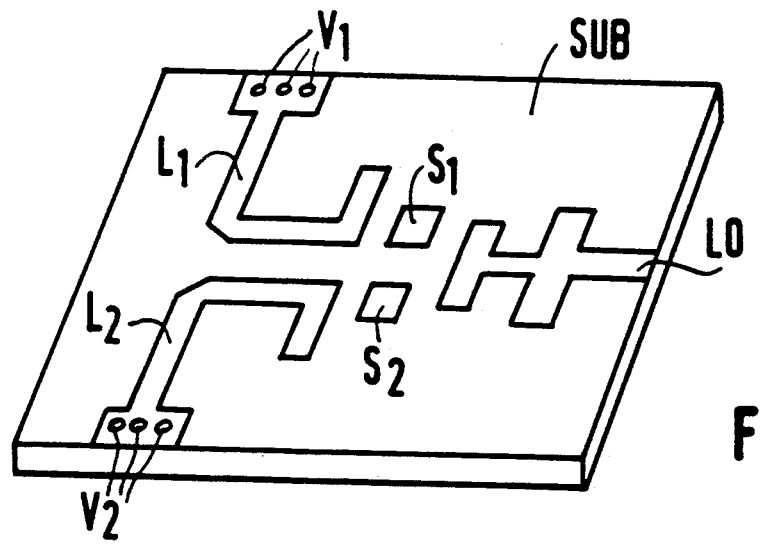
FIG. 1 proposes an example of the printed circuit for the mixer according to the invention.

FIG. 1 represents an embodiment of a high-loss two-sided copper substrate printed circuit (SUB), for example of epoxy glass, which can be used in the mixer according to the invention. In the Figure the ground plane on the counter face is not shown; the ground plane is realized of solid copper. On the top surface (visible in the Figure) two lines (microstrip) $L_1$ and $L_2$ are printed which are symmetrical, have an equal length and are connected to ground (ground plane) by means of metallic holes: $V_1$ and $V_2$. Two identical and symmetrical studs $S_1$ and $S_2$ as well as the line LO receiving the signal from the local oscillator are also printed.

Figure 2:
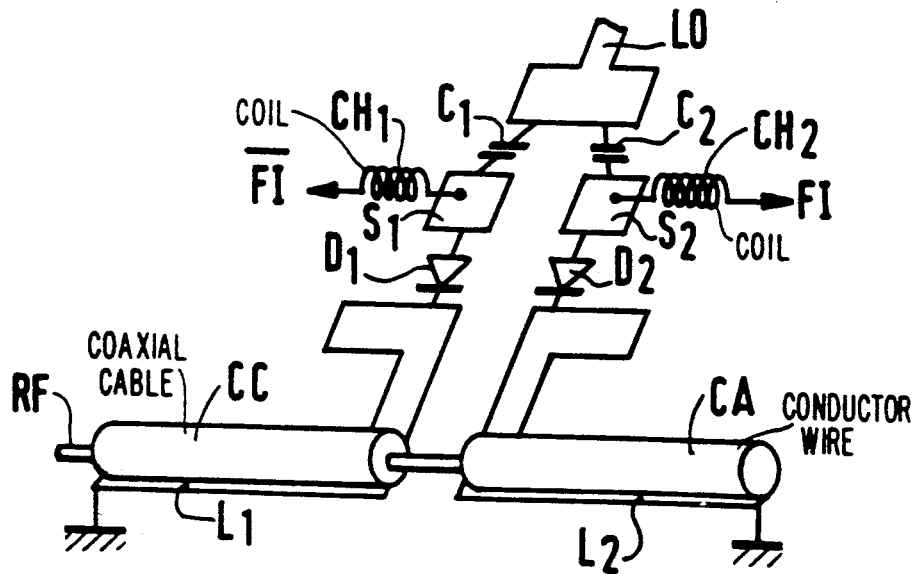
FIG. 2 shows an example of the arrangement of the main components necessary for the operation of the mixer.

FIG. 2 shows the following stage of the manufacture of the mixer according to the invention, which consists of soldering a semi-rigid cable section CC onto the microstrip line $L_1$ while the coaxial cable partly covers line $L_1$. The microstrip line determines the characteristic impedance $Z_c$ of the coaxial cable gain with respect to ground. The input RF (coaxial cable CC) receives the signal RF which is to be mixed with the signal LO coming from the local oscillator. A section of the conductor wire CA having the same length and the same diameter as the coaxial cable CC is soldered onto line $L_2$, which is the adapting circuit, the line $L_2$ thus being partly covered by the conductor wire CA over a length equal to that of the line section $L_1$ covered by the coaxial cable CC. The coaxial cable CC and the conductor wire CA are connected to each other. Finally, as is shown in FIG. 2, the diodes $D_1$ and $D_2$, capacitors $C_1$ and $C_2$ as well as the choke coils $CH_1$ and $CH_2$ are soldered onto the printed circuit. The cathodes of the diodes $D_1$ and $D_2$ are connected to the respective lines $L_1$ and $L_2$, whereas the anodes of these diodes are connected to the respective studs $S_1$ and $S_2$. The capacitors $C_1$ and $C_2$ are connected by their first ends to the line LO receiving the signal coming from the local oscillator whereas the second ends of the capacitors $C_1$ and $C_2$ are connected to the studs $S_1$ and $S_2$, respectively. Finally, the choke coils $CH_1$ and $CH_2$ are connected by their first ends to the respective studs $S_1$ and $S_2$ thus permitting to tap signals $\overline{FI}$ and FI at their second ends, which signals are intermediate-frequency signals having opposite phases.

Figure 3:
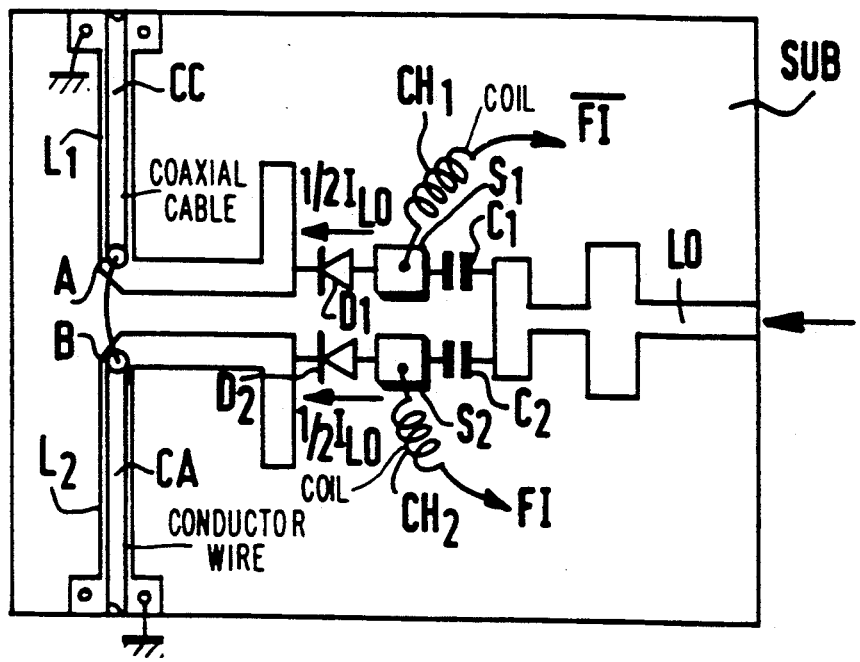
FIG. 3 shows the routing of the signals in the circuit seen from the side of the signal coming from the local oscillator.
Figure 4:
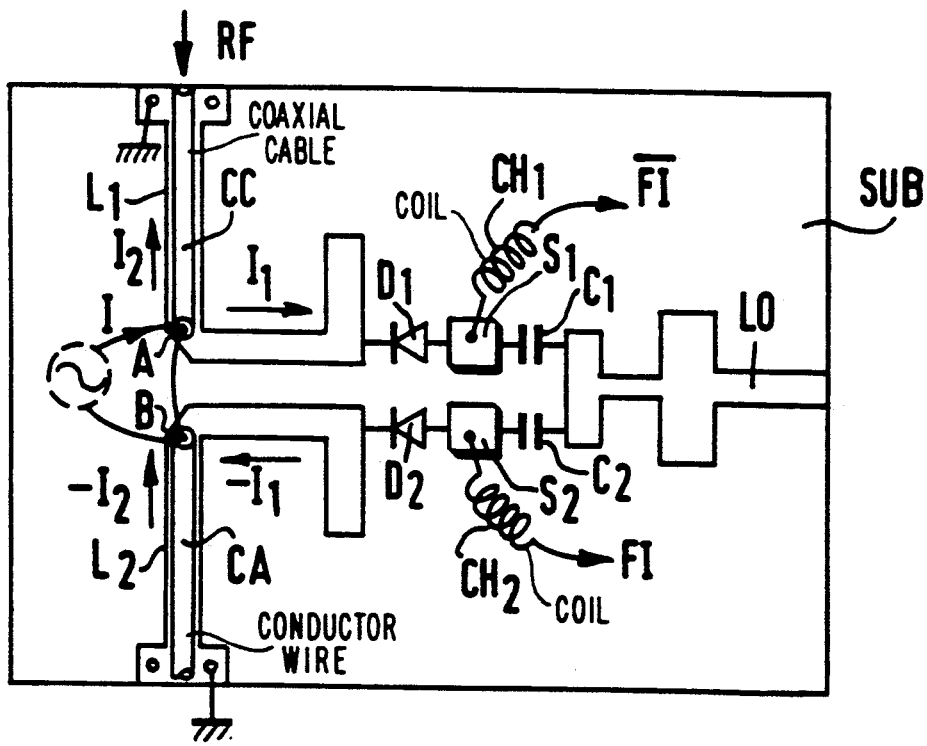
FIG. 4 shows the routing of the signals in the circuit seen from the side of the signal RF.

FIGS. 3 and 4 enable to comprehend the operation of the circuit by following the routing of the signals in said circuit seen from the side of the signal LO coming from the local oscillator and from the side of the signal RF.

Let us first look at the circuit seen from the side of the signal LO (FIG. 3). Because of symmetry, the signal LO from the local oscillator is equally divided between the two circuits formed by the elements $C_1$, $D_1$ and $L_1$ and also by the elements $C_2$, $D_2$ and $L_2$. Thus half the current $I_{LO}$ coming from the local oscillator is led towards the circuit formed by $C_1$, $D_1$, $L_1$ whereas the other half is led to the circuit formed by $C_2$, $D_2$, $L_2$. Let us consider the points A and B, where A is the end of the coaxial cable CC connected to the end B of the conductor wire CA. As the two points A and B are equipotential, no power is sent in cable CC to the side of the signal RF.

Alternatively, when the circuit is seen from the side of the signal RF (FIG. 4), the coaxial cable may be regarded as a generator RF (symbolized by the generator for alternative signals shown in a dotted line in the Figure) which would be connected between the points A and B. At point A the current I is divided into $I_1$, current derived in the diode $D_1$, and $I_2$, current derived in the branch of $L_1$ covered by the coaxial cable CC. Because of symmetry, the current $-I$ formed by the sum of the current $-I_1$ from the diode $D_2$ and the current $-I_2$ from the line branch $L_2$ covered by the conductor wire CA is captured at point B. The line LO then has no voltage at all and thus no power is sent towards the local oscillator, which implies that the circuits LO and RF are uncoupled very well.

Let us now consider the mixer in operation, that is to say, when it starts supplying simultaneously the signals RF and LO. The two diodes $D_1$ and $D_2$ are simultaneously driven and thus in phase with the signal LO; conversely, they are driven in series and thus in phase opposition to the signal RF. Thus, after mixing, a signal FI will be obtained which is in phase opposition (with $\overline{FI}$) to both diodes.

The intermediate-frequency signal is tapped by means of a choke coil ($CH_1$ for $\overline{FI}$ and $CH_2$ for FI) which has a very high impedance at high-frequency, that is to say, for the frequencies of the signals RF and LO and a very low impedance at the intermediate frequency FI.

In addition to the manner in which the mixer according to the invention is realized, a simple but explicit analysis will enable a better comprehension of the innovative concept and also of the results obtained, which results will be surprising to those skilled in the art. This analysis may be divided into two parts relating to two questions.

The first question may be formulated as follows. Why is it possible to use a substrate presenting a loss in a mixer comprising a "Balun" circuit?

The loss in a high-frequency circuit may be divided into loss due to conduction, that is to say, serial loss in the copper, and dielectric loss, that is to say, parallel loss.

A circuit of which the dielectric material presents a loss will thus augment parallel loss. This loss is a function of the impedance of the circuits, the higher the impedance the higher the loss will be.

The customary high-frequency mixers are symmetrical and it is quite often possible to turn the input RF (signal) and the input LO (local oscillator) around without appreciably degrading the operation.

But the mixer comprising a "Balun" circuit is distinctly dissymmetrical (by definition). Thus, the circuit LO is completely deposited on the substrate presenting a loss; however, it is easy to compensate for this loss by augmenting the level of the input LO.

From the side of the circuit RF (see FIG. 4), the signal RF arrives without a loss through the cable at points A and B, where it is subdivided into two symmetrical parts each having a 25 Ohm impedance, since the 50 Ohm cable impedance is to supply power to the parts in series.

Figure 5:
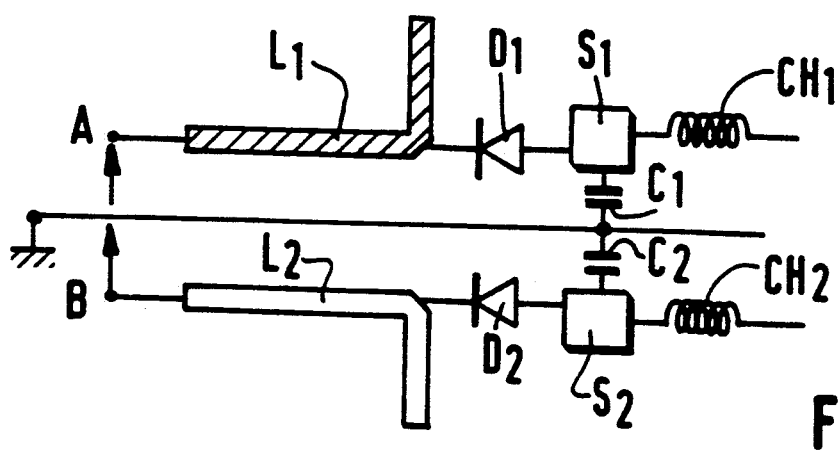
FIG. 5 proposes a replacement diagram of the mixer.

In FIG. 5 (equivalent diagram of the mixer), the capacitor $C_1$ behaves as a short circuit HF, the loss of the elementary circuit RF is limited to the cross-hatched section which allows to adapt the impedance from 50 Ohm to 25 Ohm of the diode $D_1$.

The loss is reduced because of the small dimension of the circuit and also the low impedance.

Thus, the dissemmetry of the mixer comprising a "Balun" circuit is interesting because it allows to minimize the dielectric loss of the circuit RF, which explains the good performance of this mixer when epoxy glass is used as a substrate.

The second question may then also be formulated. Why can a coaxial cable be used at frequencies of the order of 10 GHz?

Normally, when high-frequency is concerned, it is considered a rule by a person skilled in the art to disregard a transmission line section of less than $\lambda/10$ ($\lambda$ being the wavelength).

In principle, the semi-rigid coaxial cable is an aperiodic transmission line; the elements restricting its use as regards high frequencies are the two cable branches which, in the case of the mixer comprising a "Balun" circuit, are soldered wires (one of which being the core of the coaxial cable) whose length is in the neighborhood of the outside diameter d of the coaxial cable. The preceding rule thus permits to set forth the following relationship: $d < \lambda$ cable/10.

If, for example $d = 1.3$ mm, it follows that the wavelength $\lambda$ of the cable is to exceed 13 mm, with $\epsilon_r = 2$ a maximum frequency of approximately 15 GHz is allowed. By limiting the frequency, at which the mixer according to the invention is used, to 10 GHz, a considerable safety margin is assured and a proper operation is thus guaranteed.

A mixer of this type may advantageously be used in a transceiver block for a radio altimeter.

According to an exemplary embodiment, for a frequency band of about 4.2 to 4.4 GHz and for a choice of the outside diameter of the semi-rigid coaxial cable of 1.2 mm, the length of the coaxial cable was 11 mm. This coaxial cable was soldered onto a balancing line of 1.6 mm in width and 11 mm in length supported by a 0.8 mm-thick epoxy glass substrate.

In this embodiment, the insulation LO/RF obtained was 26 dB in said band and the noise factor NF of the receiver measured at the frequency FI of the radio altimeter (25 kHz) was 10 dB, which is certainly comparable to that of the equivalent mixers operating under the same conditions but realized on noble substrates such as teflon glass.

A mixer of this type may replace to advantage a 6 λ/4 ring mixer when there is a space problem or a problem as regards the quality of the printed circuit substrate.

This type of mixer is aperiodic; basically, nothing makes it depend on frequency, it is the adaptation of the circuits that limits the frequency response. Thus, although it is aperiodic in theory, the limitation comes from the adapting circuits LO and RF. In effect, and as a first approximation, if Zd is the impedance of a mixing diode ($D_1$ or $D_2$), the circuit LO is to adapt two times the impedance Zd in parallel, that is, Zd/2, and the circuit RF two times the impedance Zd in series, that is, 2Zd, which results in a limitation of the frequency band.

Another limitation may originate from the practical realization of cable sections. Thus, towards the low frequencies, the length of the balancing lines limits the field of application to approximately 1 GHz. At this frequency the length of the section is equal to 40 mm. The same holds for the high frequencies, the realization of the cable section of a calibrated length becomes delicate. With the length of the cable section being equal to 3 mm at a frequency of 10 GHz, it seems that this threshold will not easily be surpassed.

In conclusion, a mixer of this type can be advantageously used in a frequency band from 1 to 10 GHz because it is robust, not very cumbersome and because its low cost permits to considerably reduce the cost price of a material which would use various mixing elements as is the case at present. Besides, during various comparative tests, compared under the same conditions of operation as of a conventional 4 λ/4 ring mixer (mixer having two branches) of a noble substrate such as teflon glass, this mixer has provided better results. Thus, these comparative tests have allowed to ascertain a better decoupling between the signals RF and LO of approximately 10 dB (a practical improvement by ⅓) in favor of the mixer according to the present invention.

I claim:

1. A balanced high-frequency mixer formed by a "Balun" type circuit comprising a dielectric substrate supporting conductor material in a configuration of lines and a ground plane situated in parallel or coinciding planes, characterized in that the substrate is chosen from high-loss dielectric materials, and a section of semi-rigid low-loss coaxial cable is associated to a line of said conductor material while a conductor wire section of the same length and the same diameter as the cable, connected to the cable, is associated to a second line of said conductor material while said coaxial cable and wire sections at least partly cover said lines of said conductor material.

2. A balanced high-frequency mixer as claimed in claim 1, characterized in that a two-sided epoxy glass printed circuit is used, the epoxy glass comprising the high-loss dielectric substrate the conductor lines and ground plane being obtained by engraving the printed circuit, while the semi-rigid coaxial cable sections and conductor wire sections are soldered onto the conductor lines.

3. A balanced high-frequency mixer as claimed in claim 1, characterised in that a multilayer epoxy glass printed circuit is used for performing a plurality of functions.

* * * * *